United States Patent [19]

Prochazka

[11] 4,039,976
[45] Aug. 2, 1977

[54] COAXIAL CURRENT PROBE

[75] Inventor: Rudolph J. Prochazka, Springfield, Va.

[73] Assignee: The United States of America as represented by the Secretary of the Army, Washington, D.C.

[21] Appl. No.: 604,738

[22] Filed: Aug. 14, 1975

[51] Int. Cl.² .......................... H01P 5/02; H01P 5/08; G01R 21/12; G01R 29/08
[52] U.S. Cl. .................................. 333/24 R; 324/95; 333/97 R
[58] Field of Search .................... 333/97 R, 24 R, 33, 333/10; 324/126, 127, 128, 95

[56] References Cited

U.S. PATENT DOCUMENTS 3,656,072   4/1972   Ludwig et al. .................... 333/97 R

*Primary Examiner*—Archie R. Borchelt
*Assistant Examiner*—Marvin Nussbaum
*Attorney, Agent, or Firm*—Nathan Edelberg; Robert P. Gibson; Saul Elbaum

[57] ABSTRACT

A current probe for coaxial conductors including a coaxial coupling having a transformer surrounding the central conductor and a coaxial passive load assembly within the coupling connected between the central and outer conductors. The transformer and passive-load components are interchangeable with others of different characteristics.

8 Claims, 3 Drawing Figures

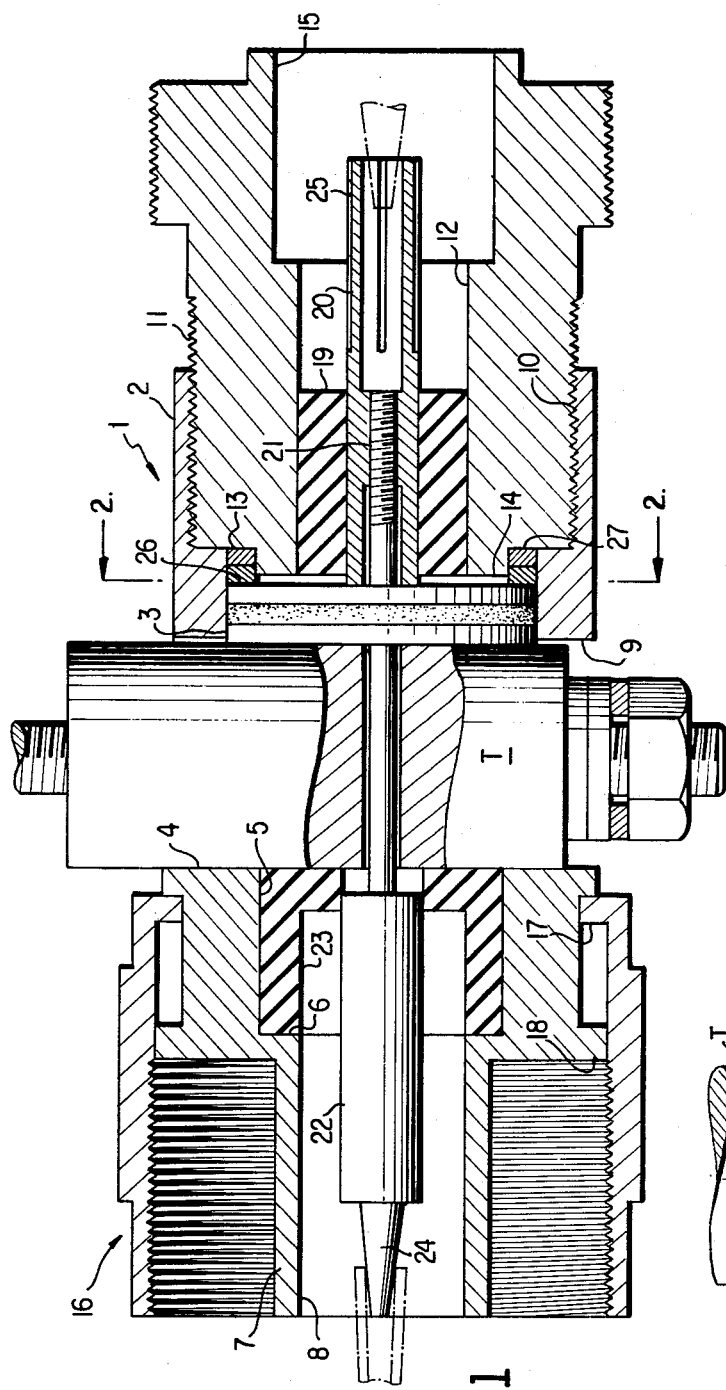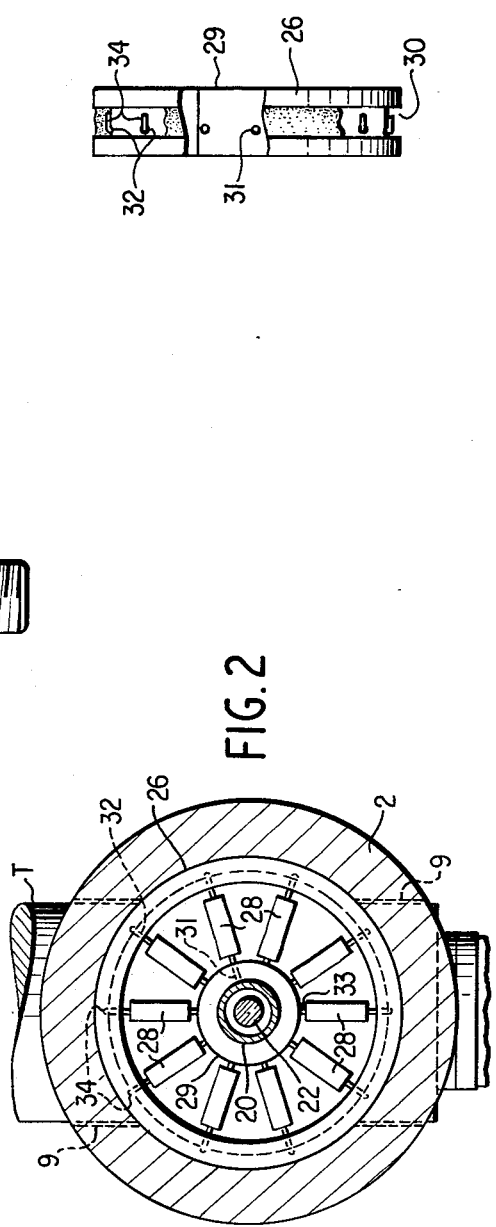

COAXIAL CURRENT PROBE

The invention described herein may be manufactured, used, and licensed by or for the United States Government for governmental purposes without the payment to me of any royalty thereon.

BACKGROUND OF THE INVENTION

The present invention relates to probes for sensing currents in conductors and is concerned, more particularly, with the measurement of currents in coaxial cable systems.

BRIEF DESCRIPTION OF THE PRIOR ART

Attempts have been made in monitoring the voltage and current characteristics, variations and timing, as well as stray currents which may occur, in high frequency coaxial cable systems. The determination of these factors is important in that the calibration or detection of such factors is necessary to the accuracy of the result to be achieved with the circuit or instrument with which the cable is associated.

Typically, prior attempts in monitoring or probing coaxial cables have involved interruption of the coaxial relationship of the conductors, with a consequent loss of shielding or disruption of the high frequency characteristics of the cable. Further, such prior probes have themselves caused signal alternation and inaccuracies, by undesirable loading of the circuit, or have been prone to undesirable characteristics, such as reflections in pulse applications.

Mechanically, prior probes for coaxial cables have been in the nature of lateral interruptions of the coaxial relationship and required special fittings and adaptors which not only interfere with the purpose of coaxial conductors, but also interpose complicated structors which are adverse to versatility of use with different components to monitor differing ranges of frequencies, voltages and the like.

Accordingly, prior probes for coaxial cables have not been found to be entirely satisfactory.

SUMMARY OF THE INVENTION

In general, the preferred form of probe of the present invention comprises a coaxial probe coupling for coaxial cables and having an inner conductor and an outer conductor, a passive load member in communication between the inner and outer conductors, and a transformer surrounding and spaced from the center conductor and having a terminal in communication with the outer conductor.

Preferably, the probe coupling is axially assembled by means of threaded components which position and secure the conductors, load member and transformer and which mate with conventional coaxial couplings.

OBJECTS OF THE INVENTION

It is an object of the present invention to provide a probe for coaxial cables which preserves the coaxial characteristics of the cable.

It is another object of the present invention to provide a coupling for coaxial cables which incorporates a coaxial probe assembly which preserves the coaxial relationship of the cable.

It is a further object of the present invention to provide a coupling for coaxial cables which incorporates a dismountable, coaxial probe assembly having readily interchangeable components.

It is a still further object of the present invention to provide a probe coupling for coaxial cables which incorporates an axially-dismountable, coaxial probe assembly including a transformer surrounding the inner conductor and in communication with the outer conductor.

A further object of the present invention is the provision of a probe coupling for coaxial cables which incorporates an axially-dismountable, coaxial probe assembly including a transformer surrounding the inner conductor and in communication with the outer conductor, and a load member adjacent the transformer and in communication with the inner and outer conductors.

A still further object of the present invention is the provision of a probe coupling for coaxial cables which incorporates an axially dismountable, coaxial probe assembly including a load member comprising a central hub and an outer ring communicating via passive load elements positioned radially between the hub and the ring.

BRIEF DESCRIPTION OF THE DRAWINGS

These and other objects of the invention and a better understanding thereof may be derived from the following description and accompanying drawings, in which:

FIG. 1 is a sectional side view of a probe coupling embodying the invention;

FIG. 2 is a cross-sectional view taken along lines 22 of FIG. 1; and

FIG. 3 is a side view of a changeable loading element showing the preferred structure thereof.

DETAILED DESCRIPTION OF THE PREFERRED EMBODIMENT

As shown in FIGS. 1 and 2, the preferred form of feedthrough probe-coupling comprises a body 1 having a cylindrical outer surface 2 and a cylindrical main bore 3 therein. The main bore terminates at a shoulder portion 4 and joins an insulation bore 5 which, in turn, terminates at a shoulder 6 adjacent a cylindrical portion or sleeve 7 having a bore 8 therein.

The body 1 has a transverse slot 9 extended therethrough immediately adjacent the shoulder 4 in the main bore 3, for receiving a transformer T as will be discussed more fully hereinafter.

At the end of the main bore remote from the shoulder 4, the body 1 includes a threaded portion 10 for receiving a threaded removable nipple 11 having a bore 12 therein. Adjacent the main bore of the body, the nipple 11 includes an annular shoulder 13 and a cylindrical extension 14. At its opposite end, the bore 12 of the nipple has an enlarged portion 15 sufficient to receive the sleeve of another coupling. Also, the outer surface in the region of the enlarged bore 15 is sized and threaded to receive a threaded collar of another coupling. The body 1 itself carries a threaded collar 16 rotably thereon and having a shoulder 17 engageable with a shoulder 18 on the outer surface 2 of the body.

Within the bore 12 of the nipple 11, an insulator 19 carries a hollow, removable inner-conductor 20 which has a threaded portion 21 for securing a solid inner conductor 22 extended through the main bore 3, insulator bore 5 and sleeve 7. The solid conductor 22 is positioned, with regard to the bore 5, by an insulator 23 therein.

The ends of the inner conductor 20 and 22 are arranged to meet and couple with mating conductors adjacent couplings, as shown in dotted lines in FIG. 1. Accordingly, the solid conductor 22 terminates in a taper 24, while the hollow conductor terminates in a slotted recess 25.

Within the main bore 3, the transformer T is grounded to the body 1 and nipple 11, and is secured against the shoulder 4, by means of an outer ring 26 and one or more annular spacers 27, as may be required for proper securement.

The probe coupling of the present invention is especially advantageous in cases in which it is desired to impose a minor loading of the system. A best shown in FIG. 2, the load member is formed with the ring 26 by a plurality of passive elements 28 radially arranged in parallel communication between the ring 26 and a hub 29 which is in communication with the inner conductor. As shown in the drawings, contact of the hub 29 with the inner conductor is assured by contact between the hub and the end of the hollow conductor 20. It is to be understood that such contact of the hub with the central conductor 20/22 may be made in any desired manner.

The passive elements 28 may be resistors, capacitors, inductors, diodes or any desired passive units, depending upon the desired monitoring function and the circumstances present in the coaxial cable system.

Most advantageously, the loading members are formed as changeable units to match a wide selection of cables and instrumentation impedances. As best shown in FIG. 3, a peripheral groove 30 in the ring 26 and a series of radially-aligned holes 31 and 32, respectively, in the hub 29 and the ring 26, permit the inner and outer leads 33 and 34 of each of the passive elements 28 to be soldered in a pair of the aligned holes 31 and 32, to form a coax-like loading element which minimizes loading effects and is easily mounted and dismounted axially in the annular chamber or main bore 3 of the coupling.

Therefore, it is apparent that the present invention provides a uniquely advantageous probe for monitoring the characteristics of high frequency current in coaxial conductors. In addition to the measurement or evaluation of such current, the coupling probe of the present invention may be employed to sense current characteristics for command purposes, such as synchronization, without disruption or degradation of the characteristics of the coaxial conductor.

The preferred form of coupling probe is especially advantageous and versatile by reason of the easy disassembly and the consequent changeability of the transformer and load member to suit different circumstances.

I wish it to be understood that I do not desire to be limited to the exact details of construction shown and described, for obvious modifications can be made by a person skilled in the art.

What is claimed is:

1. A coupling probe for coaxial conductors including
   a. a coupling body having
   b. coupling means for coupling with a coaxial conductor,
   c. a bore in said coupling body,
   d. a central conductor in said bore,
   e. an annular conductor surrounding said central conductor and spaced therefrom to form
   f. a chamber,
   g. a passive load member positioned in said chamber and in communication between said central and annular conductors,
   h. and transformer means surrounding and spaced from said central conductor and in communication with said annular conductor.

2. A coupling probe as set forth in claim 1 in which said coupling body is conductive and forms said annular conductor.

3. A coupling probe as set forth in claim 2 in which said coupling body has a transverse slot therein and the transformer means includes a transformer member secured in said slot.

4. A coupling probe as set forth in claim 2 including mounting means including an axially-removable member for mounting said passive load member in said chamber.

5. A coupling probe as set forth in claim 4 in which said coupling body has a transverse slot therein adjacent said chamber, the transformer means including a transformer member in said slot and in mounting engagement with said passive load member.

6. A coupling probe as set forth in claim 4 in which said central conductor is secured by said axially-removable member.

7. A coupling probe as set forth in claim 4 in which said chamber is annular, and said passive load member includes a central hub and an outer ring and passive load means in communication between said hub and said ring.

8. A coupling probe as set forth in claim 7 in which said passive load means includes a plurality of load elements positioned radially between said hub and said ring.

* * * * *